US010921664B2

(12) United States Patent
Mochizuki et al.

(10) Patent No.: US 10,921,664 B2
(45) Date of Patent: *Feb. 16, 2021

(54) SUBSTRATE INCLUDING SEMICONDUCTORS ARRANGED IN A MATRIX AND A DISPLAY DEVICE

(71) Applicant: Japan Display Inc., Minato-ku (JP)

(72) Inventors: Kazuhide Mochizuki, Tokyo (JP); Hitoshi Tanaka, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/357,469

(22) Filed: Mar. 19, 2019

(65) Prior Publication Data

US 2019/0212620 A1 Jul. 11, 2019

Related U.S. Application Data

(63) Continuation of application No. 15/874,221, filed on Jan. 18, 2018, now Pat. No. 10,281,783.

(30) Foreign Application Priority Data

Jan. 20, 2017 (JP) .................................. 2017-008619

(51) Int. Cl.
H01L 29/12 (2006.01)
G02F 1/1362 (2006.01)
G02F 1/1368 (2006.01)
H01L 27/12 (2006.01)
G02F 1/1345 (2006.01)
H01L 29/786 (2006.01)

(52) U.S. Cl.
CPC ...... *G02F 1/136209* (2013.01); *G02F 1/1345* (2013.01); *G02F 1/1368* (2013.01); *G02F 1/136227* (2013.01); *G02F 1/136286* (2013.01); *H01L 27/124* (2013.01); *G02F 1/136213* (2013.01); *G02F 2201/121* (2013.01); *G02F 2202/10* (2013.01); *H01L 27/1225* (2013.01); *H01L 29/78633* (2013.01); *H01L 29/78693* (2013.01)

(58) Field of Classification Search
CPC .......................... H01L 27/124; H01L 27/1225
See application file for complete search history.

(56) References Cited

U.S. PATENT DOCUMENTS 10,281,783 B2 * 5/2019 Mochizuki ............ G02F 1/1345
2003/0025848 A1 2/2003 Sera
2004/0126945 A1 7/2004 Shibata
(Continued)

FOREIGN PATENT DOCUMENTS

JP 2016-134388 7/2016

*Primary Examiner* — Samuel A Gebremariam
(74) *Attorney, Agent, or Firm* — Oblon, McClelland, Maier & Neustadt, L.L.P.

(57) ABSTRACT

According to one embodiment, a display device including an insulating substrate, a first gate driver, a first gate line and a conductive material layer is provided. The first gate line has a first end connected to the first gate driver and a second end opposite to the first end, and extends in a first direction. The conductive material layer is located between the insulating substrate and the first gate line, overlaps the first gate line, and extends in the first direction. In the display device, the second end of the first gate line is electrically connected to the conductive material layer.

14 Claims, 10 Drawing Sheets

(56) References Cited

U.S. PATENT DOCUMENTS

| | | |
|---|---|---|
| 2007/0184587 A1 | 8/2007 | You |
| 2010/0020256 A1 | 1/2010 | Lee |
| 2010/0134396 A1 | 6/2010 | Umezaki |
| 2013/0082272 A1 | 4/2013 | Nakanishi |
| 2015/0009467 A1 | 1/2015 | Daishi |
| 2015/0303307 A1* | 10/2015 | Hara ............... H01L 29/7869 349/43 |
| 2016/0209719 A1 | 7/2016 | Yamaguchi et al. |
| 2016/0334657 A1 | 11/2016 | Jeon |
| 2017/0162606 A1 | 6/2017 | Yan |
| 2017/0168334 A1 | 6/2017 | Yamaguchi et al. |
| 2017/0184915 A1 | 6/2017 | Yang |
| 2017/0343845 A1 | 11/2017 | Yamaguchi et al. |

\* cited by examiner

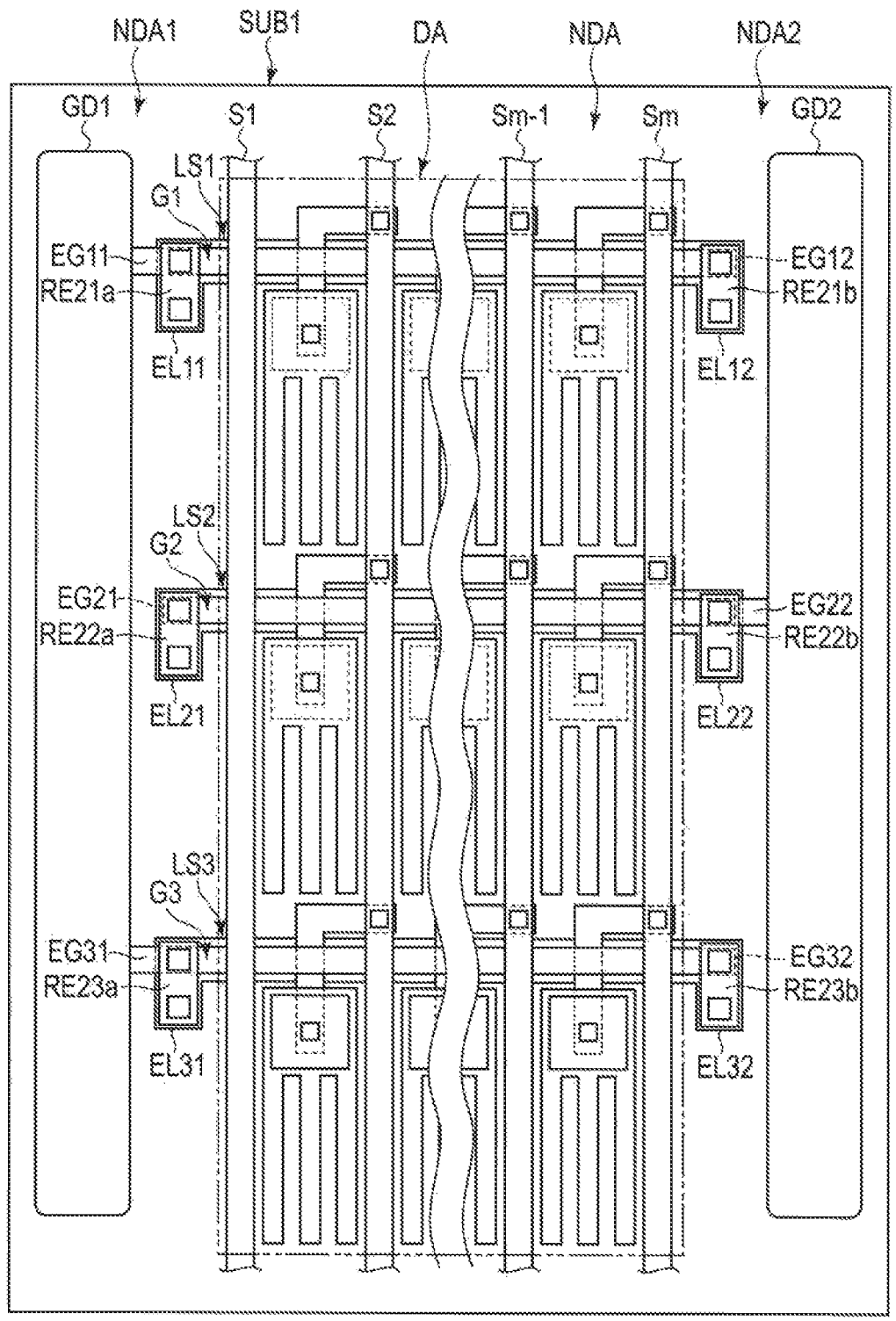
F I G. 7

SUBSTRATE INCLUDING SEMICONDUCTORS ARRANGED IN A MATRIX AND A DISPLAY DEVICE

CROSS-REFERENCE TO RELATED APPLICATIONS

This application is a continuation of U.S. application Ser. No. 15/874,221, filed Jan. 18, 2018, and is based upon and claims the benefit of priority from Japanese Patent Application No. 2017-008619, filed Jan. 20, 2017, the entire contents of which are incorporated herein by reference.

FIELD

Embodiments described herein relate generally to a display device.

BACKGROUND

In liquid crystal display devices used in smartphones, tablet computers, etc. there has been demand for narrower frames. Therefore, if circuits such as a gate driver are built in a display panel, the built-in circuits usually adopt a one-side drive/one-side power supply method.

In a transmissive liquid crystal display device, to prevent deterioration of a switching element and leak current, a light-shielding layer serving as a shield against light from a backlight is provided in some cases. It is known that, to prevent the light-shielding layer from becoming electrically floating, the light-shielding layer is electrically connected to a gate electrode of the switching element, for example.

BRIEF DESCRIPTION OF THE DRAWINGS

FIG. 7 is a plan view of another structural example of the first substrate.

DETAILED DESCRIPTION

Figure 1:
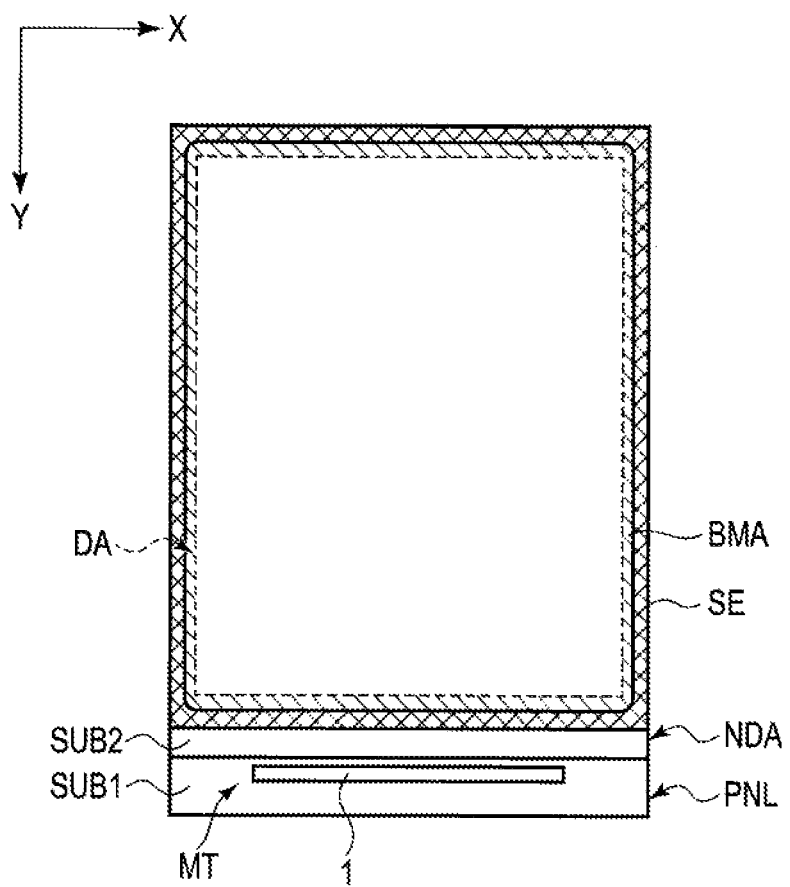
FIG. 1 is a diagram showing the structure of a display device of the present embodiment.

In general, according to one embodiment, a display device including an insulating substrate, a first gate driver, a first gate line and a conductive material layer is provided. The first gate line has a first end connected to the first gate driver and a second end opposite to the first end, and extends in a first direction. The conductive material layer is located between the insulating substrate and the first gate line, overlaps the first gate line, and extends in the first direction. In the display device, the second end of the first gate line is electrically connected to the conductive material layer.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

FIG. 1 shows the structure of a display device DSP of the present embodiment. A first direction X and a second direction Y shown in the drawing cross each other. For example, the first direction X and the second direction Y orthogonally cross each other, but the first direction X and the second direction Y may cross each other at an angle other than an angle of 90 degrees.

In the present embodiment, a liquid crystal display device will be described as an example of the display device. The main structure disclosed in the present embodiment is also applicable to various display devices such as a self-luminous display device having an organic electroluminescent display element, etc., an electronic paper-type display device having an electrophoretic element, etc., a display device adopting a micro-electromechanical system (MEMS), and an electrochromic display device.

The display device DSP includes a display panel PML, a driver IC chip 1 which drives the display panel PNL, etc. The display panel PNL is a liquid crystal display panel, for example, and includes a first substrate SUB1, a second substrate SUB2, a sealant SE, a peripheral light-shielding layer BMA and a liquid crystal layer (liquid crystal layer LC which will be described later). The second substrate SUB2 is opposed to the first substrate SUB1. The sealant SE is provided in a region shown by rising diagonal lines, and attaches the first, substrate SUB1 and the second substrate SUB2 to each other. The peripheral light-shielding layer BMA is provided in a region shown by falling diagonal lines, and is formed of the same material as that of a light-shielding layer BM which will be described later. The display panel PNL includes a display area DA which displays an image, and a non-display area NDA which has the shape of a frame and surrounds the display area DA. In the present embodiment, the display area DA is a region enclosed in the peripheral light-shielding layer BMA, and the non-display area NDA is a region in which the peripheral light-shielding layer MBA is provided.

The driver IC chip 1 is located in the non-display area NDA. In the example illustrated, the driver IC chip 1 is provided in a mounting portion MT of the first substrate SUB1 which extends beyond the second substrate SUB2. For example, a display driver which outputs a signal necessary for image display is incorporated in the driver IC chip 1. The display driver here includes at least part of a source driver SD, a gate driver GD and a common electrode driver circuit CD which will be described later. The driver IC chip 1 is not limited to the example illustrated but may be provided on a flexible printed circuit board which is separately connected to the display panel PNL.

The display panel PNL of the present embodiment may be any one of a transmissive display panel having a transmissive display function of displaying an image by selectively transmitting light from a back surface side of the first substrate SUB1, a reflective display panel having a reflective display function of displaying an image by selectively reflecting light from a front surface side of the second substrate SUB2, and a transflective display panel having the transmissive display function and the reflective display function.

Further, although detailed description of the structure of the display panel PNL will be omitted here, the display panel PNL may have a structure conforming to any one of a display mode using a lateral electric field along an X-Y plane or a main surface of a substrate, a display mode using a longitudinal electric field along a normal of the X-Y plane, and a display mode using an oblique electric field which is oblique with the X-Y plane. Still further, the display panel PNL may have a structure conforming to a display mode using an arbitrary combination of the longitudinal electric field, the lateral electric field and the oblique electric field.

Figure 2:
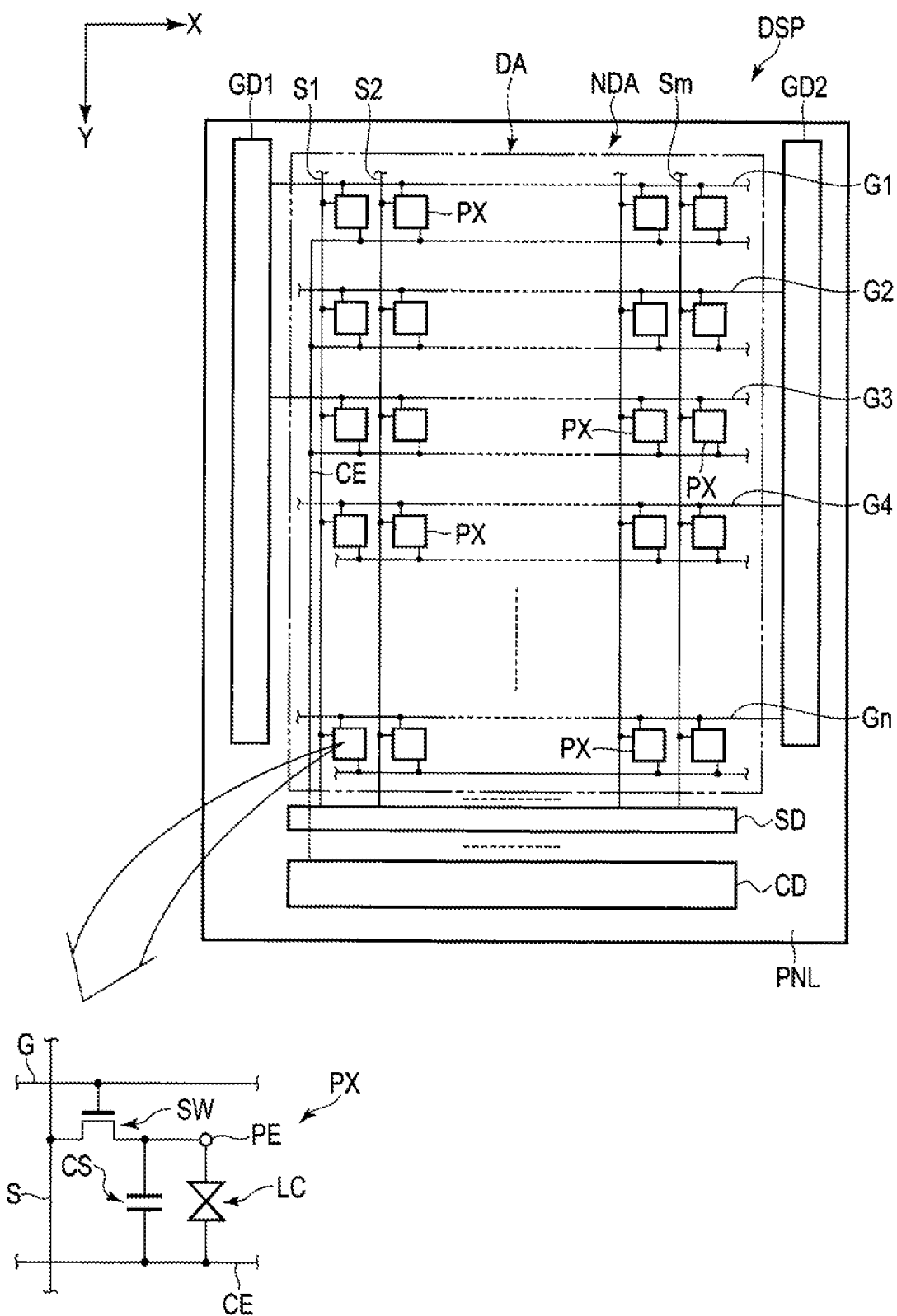
FIG. 2 is a diagram showing the basic structure and the equivalent circuit of a display panel shown in FIG. 1.

FIG. 2 is a diagram showing the basic structure and the equivalent circuit of the display panel PNL shown in FIG. 1. The display panel PNL includes a plurality of pixels PX in the display area DA. The pixels PX are arranged in a matrix. Further, the display panel PNL includes a plurality of gate lines G (G1 to Gn), a plurality of source lines S (S1 to Sm), a common electrode CE, etc., in the display area DA. The gate lines G extend in the first direction X and are arranged in the second direction Y. The source lines S extend in the second direction Y and are arranged in the first direction X. The gate lines G and the source lines S are not necessarily extended linearly but may be partially bent. The common electrode CE is provided over the pixels PX.

The display panel PNL includes gate drivers GD1 and GD2, and a source driver SD in the non-display area NDA. The gate driver (first gate driver) GD1 and the gate driver (second gate driver) GD2 face each other across the display area DA in the first direction X. The gate lines G are connected to one of the gate drivers GD1 and GD2. In the example illustrated, the odd-numbered gate lines G1, G3, . . . are connected to the gate driver GD1. The even-numbered gate lines G2, G4, . . . are connected to the gate driver GD2. The source lines S are connected to the source driver SD. The common electrode CE is connected to the common electrode driver circuit CD. The source driver SD, the gate driver GD1 and GD2 and the common electrode driver CD may be formed on the first substrate SUB1 or may be partially or entirely incorporated in the driver IC chip 1 shown in FIG. 1, in the non-display area NDA.

Each pixel PX includes a switching element SW, a pixel electrode PE, the common electrode CE, a liquid crystal layer LC, etc. The switching element SW is formed of a thin-film transistor (TFT), for example, and is electrically connected to the gate line G and the source line S. The gate line G is connected to the respective switching elements SW of the pixels PX arranged in the first direction X. The source line S is connected to the respective switching elements SW of the pixels PX arranged in the second direction Y. The pixel electrode PE is electrically connected to the switching element SW. Each pixel electrode PE is opposed to the common electrode CE and drives the liquid crystal layer LC by an electric field formed between the pixel electrode PE and the common electrode CE. Storage capacitance CS is formed between an electrode having the same potential as that of the common electrode CE and an electrode having the same potential as that of the pixel electrode PE, for example.

The gate line G, the source line S, the switching element SW, the pixel electrode PE, the common electrode CE, etc., are provided in the first substrate SUB1 shown in FIG. 1.

Figure 3:
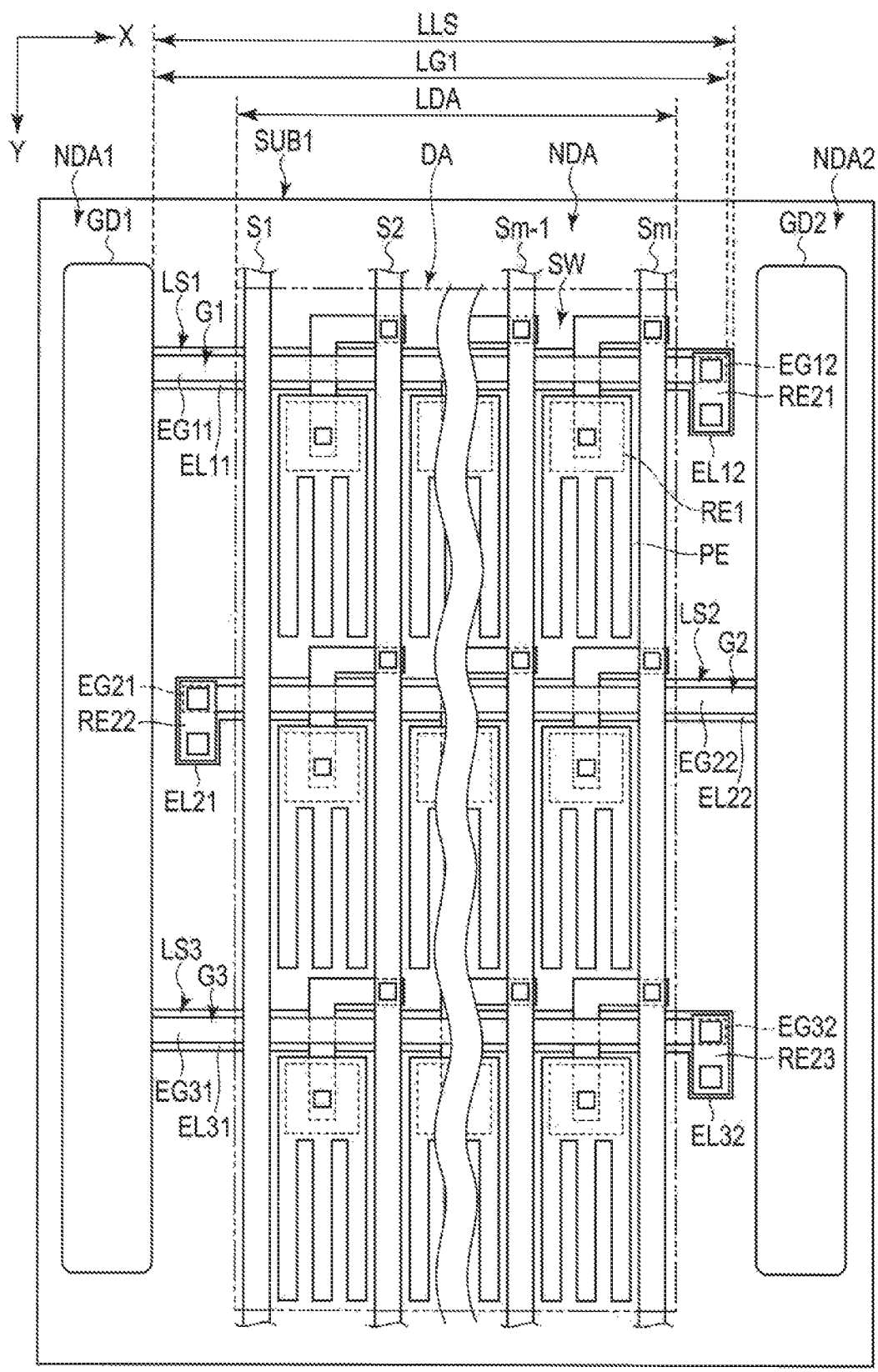
FIG. 3 is a plan view of a structural example of a first substrate.

FIG. 3 is a plan view of a structural example of the first substrate SUB1. The first substrate SUB1 is one of the substrates which constitute the display panel PNL. The example illustrated corresponds to an example adopting a fringe field switching (PFS) mode, which is one of the display modes using the lateral electric field.

The first substrate SUB1 is located over the display area DA and the non-display area NDA. The first substrate SUB1 includes light-shielding layers LS (LS1, LS2 and LS3), relay electrodes PE1, relay electrodes RE2 (RE21, RE22 and RE23), etc., in addition to the gate drivers GD1 and GD2, the gate lines G (G1, G2 and G3), the source lines S (S1, S2, Sm-1 and Sm), the switching elements SW and the pixel electrodes PE.

The gate drivers GD1 and GD2 are arranged in the non-display area NDA of the first substrate SUB1. In the example illustrated, the non-display area NDA has a first non-display area NDA1 adjacent to the left side of the display area DA and a second non-display area NDA2 adjacent to the right side of the display area DA. The gate driver GD1 is located in the first non-display area NDA1, and the gate driver GD2 is located in the second non-display area NDA2. That is, the gate driver GD1 and the gate driver GD2 face each other across the display area DA in the first direction X. In the example illustrated, the gate driver GD1 and the gate driver GD2 are arranged in regions which have length in the second direction Y and width in the first direction X.

The source lines S are formed in a strip shape having a substantially constant width, and cross the gate lines G, respectively, in the display area DA. All the source lines S are located between the gate driver GD1 and the gate driver GD2. The source line S1 corresponds to the source line closest to the first non-display area NDA1 in the display area DA, and is located at the left edge of the display area DA in the drawing. The source line Sm corresponds to the source line closest to the second non-display area NDA2 in the display area DA, and is located at the right edge of the display area DA in the drawing.

The switching elements SW are formed between the adjacent source lines S. For example, the switching element SW is arranged in the vicinity of the gate line G1 between the source line Sm-1 and the source line Sm. The switching element SW is connected to the source line Sm, and is also electrically connected to the pixel electrode PE via the relay electrode RE1. The structure of the pixel PX including the switching element SW will be described later.

The gate lines G are formed in a strip shape having a substantially constant width, and are drawn to the first non-display area NDA1 and the second non-display area NDA2. That is, both ends of the gate lines G in the first direction X are located in the non-display area NDA. More specifically, one ends EG11 and EG31 of the gate lines G1 and G3 are connected to the gate driver GD1 in the first non-display area NDA1. The other ends EG12 and EG32 of the gate lines G1 and G3 are located in the second non-display area NDA2 and are spaced apart from the gate driver GD2. In the example illustrated, the ether ends EG12 and EG32 are located between the source line Sm and the gate driver GD2. On the other hand, one end EG21 of the gate line G2 is located in the first non-display area NDA1 and is spaced apart from the gate driver GD1. In the example illustrated, one end EG21 is located between the source line S1 and the gate driver GD1. The other end EG22 of the gate line G2 is connected to the gate driver GD2 in the second non-display area NDA2.

Conductive material layers, for example, the light-shielding layers LS extend in the first direction X and overlap the gate lines G. The light-shielding layers LS, except ends thereof, are formed in a strip shape having a substantially constant width. The width here corresponds to width in the second direction Y. In the present embodiment, a length LLS of the light-shielding layer LS1 in the first direction X is greater than a length LDA of the display area DA in the first direction X. For example, the length LLS is substantially equal to a length LG1 of the gate line G1 in the first direction X. Further, both ends of the light-shielding layers LS are located in the non-display area NDA. In the non-display area NDA, the light-shielding layer LS is connected to the gate driver connected to the corresponding gate line G and is electrically connected to the gate line G at the end opposite to the gate driver.

More specifically, one end EL11 of the light-shielding layer LS1 is connected to the gate driver GD1 in the first non-display area NDA1. The other end EL12 of the light-shielding layer LS1 is located in the second non-display area NDA2 and overlaps the end EG12. That is, the other end EL12 is located between the source line Sm and the gate driver GD2 and is spaced apart from the gate driver GD2. The light-shielding layer LS1 is electrically connected to the other end EG12 via the relay electrode RB21 which overlaps the other end EL12 and the other end EG12. Accordingly, the gate line G1 and the light-shielding layer LS1 are electrically connected to each other in the second non-display area NDA2.

On the other hand, one end EL21 of the light-shielding layer LS2 is located in the first non-display area NDA1 and overlaps one end EG21. That is, one end EL21 is located between the gate driver GD1 and the source line S1 and is spaced apart from the gate driver GD1. The other end EL22 of the light-shielding layer LS2 is connected to the gate driver GD2 in the second non-display area NDA2. The light-shielding layer LS2 is electrically connected to the gate line G2 via the relay electrode RE22 which overlaps one end EL21 and one end EG21. The structure of the light-shielding layer LS3 is the same as that of the light-shielding layer LS1, and thus detailed description thereof will be omitted.

In the present embodiment, one end EG11 corresponds to the first end of the first gate line, and the other end EG12 corresponds to the second end of the first gate line. One end EL11 corresponds to the third end of the light-shielding layer, and the other end EL12 corresponds to the fourth end of the light-shielding layer. One end EG21 corresponds to the sixth end of the second gate line, and the other end EG22 corresponds to the fifth end of the second gate line. Further, the relay electrode RE21 corresponds to the first relay electrode, and the relay electrode RE22 corresponds to the third relay electrode.

Figure 4:
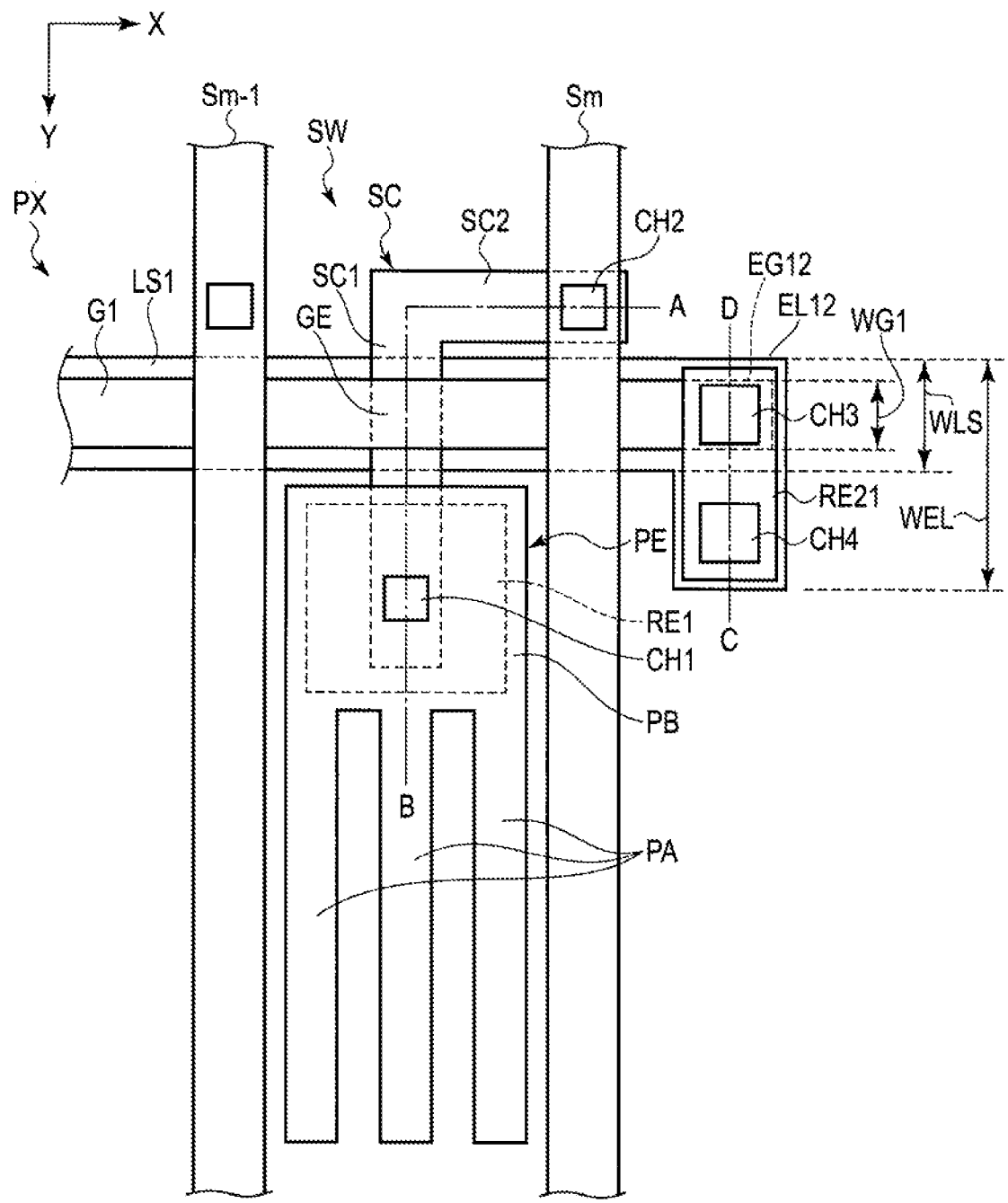
FIG. 4 is a plan view of the structure of a pixel.

FIG. 4 is a plan view of the structure of the pixel PX. This is a plan view of the first substrate SUB1. FIG. 4 is an enlarged view of the vicinity of the pixel PX which is most distant from the gate driver GD1 in the first direction X. The first substrate SUB1 includes the common electrode, for example, but the illustration of the common electrode is omitted here.

The first substrate SUB1 includes the gate line G1, the light-shielding layer LS1, the source lines Sm-1 and Sm, the switching element SW, the pixel electrode PE, the relay electrodes RE1 and RE21, etc.

The gate line G1 has a width WG1 less than a width WLS of the light-shielding layer LS1 and entirely overlaps the light-shielding layer LS1. In the example illustrated, the gate line G1 is located in a substantially center of the light-shielding layer LS1.

The switching element SW is formed between the source line Sm-1 and the source line Sm. For example, the switching element SW is a single-gate thin-film transistor which is electrically connected to the source line Sm and the pixel electrode PE. The switching element SW includes a semiconductor layer SC, a gate electrode GE, the relay electrode RE1, etc.

The semiconductor layer SC is substantially L-shaped and has a first portion SC1 and a second portion SC2. The first portion SC1 extends in the second direction Y between the source line Sm-1 and the source line Sm, and crosses the gate line G1 and the light-shielding layer SL1. The gate electrode GE corresponds to a portion of the gate line G1 crossing the first portion SC1. One end of the first portion SC1 overlaps the pixel electrode PS and the relay electrode RE1. The relay electrode RE1 is electrically connected to the first portion SC1 in a contact hole CH1 formed in a region overlapping the first portion SC1. The second portion SC2 extends from the other end of the first-portion SC1 to the source line Sm in the first direction X and crosses the source line Sm. The second portion SC2 is electrically connected to the source line Sm in a contact hole CH2 formed in a region overlapping the source line Sm. The first portion SC1 and the second portion SC2 are linearly formed in the example illustrated but may be partially bent.

The pixel electrode PE is located between the source line Sm-1 and the source line Sm. The pixel electrode PE includes an electrode portion PA and a contact portion PB. The electrode portion PA and the contact portion PB are integrally or continuously formed with each other and are electrically connected to each other. The contact portion PB is closer to the gate line G1 than the electrode portion PA. That is, the contact portion P3 is arranged in a location overlapping the relay electrode RE1 and is electrically connected to the relay electrode RE1. Accordingly, the pixel electrode PE is electrically connected to the switching element SW. The electrode portion PA extends from the contact portion PB in the second direction Y. In the example illustrated, the pixel electrode PE has three electrode portions PA. The three electrode portions PA are arranged in the first direction X at intervals and are formed in a strip shape having a substantially constant width in the first direction X. The shape of the pixel electrode PE is not limited to the example illustrated but may be appropriately changed in accordance with the shape of the pixel PX, etc. For example, the pixel electrode PE may extend in an oblique direction crossing the first direction X and the second direction Y, and the electrode portion PA may extend in the oblique direction.

Next, the other end EL12 of the light-shielding layer LS1 and the other end EG12 of the gate line G1 will be described.

In the present embodiment, the other end EL12 corresponds Co a region of the light-shielding layer LSI which nearly overlaps the relay electrode RE21. Further, the other end EG12 corresponds to a region of the gate line G1 which nearly overlaps the relay electrode RE21. In the example illustrated, the other end EL12 has the shape of a rectangle, and the sides of the rectangle in the second direction Y are longer than the sides of the rectangle in the first direction X. For example, a width (first width) WEL of the other end EL12 is about twice the width (second width) WLS. The width here corresponds to width in the second direction Y.

The relay electrode RE21 overlaps the other end EL12 and the other end EG12. More specifically, the relay electrode RE21 has a region which overlaps both the other end EL12 and the other end EG12, and a region which overlaps the other end EL12 but does not overlap the other end EG12. In the example illustrated, the relay electrode RE21 has the same shape as that of the other end EL12, and the entire relay electrode RE21 is located within the region of the other end EL12. A contact hole CH3 and a contact hole CH4 are formed in a region in which the relay electrode RE21 is provided. The contact holes CH3 and CH4 are arranged in the second direction Y. The contact hole CH3 is located in a region in which the relay electrode RE21 and the gate line G1 overlap each other. Within the region in which the relay electrode RE21 and the other end EL12 overlap each other, the contact hole CH4 is located in a region which does not overlap the gate line G1.

The relay electrode 21 is connected to the gate line G1 in the contact hole CH3. Further, the relay electrode RE21 is connected to the light-shielding layer LS1 in the contact hole CH4. In this way, the light-shielding layer LS1 and the gate line G1 are electrically connected to each other via the relay electrode RE21 in the non-display area NDA. In the example illustrated, the contact holes CH3 and CH4 have rectangular shapes having substantially equal sizes. That is, the area of a region in which the relay electrode RE21 and the gate line G1 contact each other is substantially equal to the area of a region in which the relay electrode RE21 and the light-shielding layer LS1 contact each other. However, the sizes and shapes of the contact holes CH3 and CH4 may be appropriately changed. Further, the contact hole CH3 and the contact hole CH4 may be arranged in a direction crossing the second direction Y.

Figure 5:
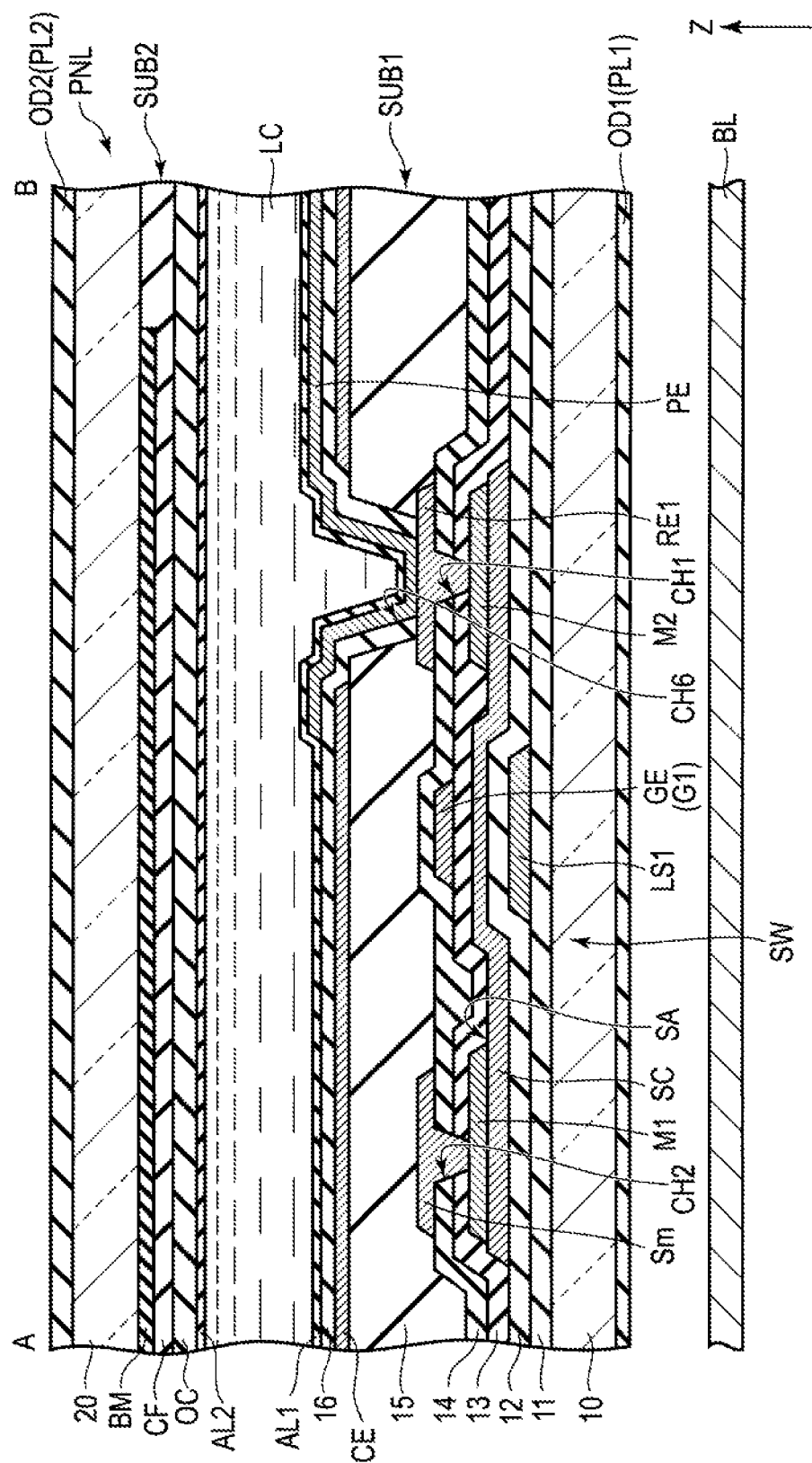
FIG. 5 is a sectional view of part of the display panel taken along line A-B shown in FIG. 4.

FIG. 5 is a sectional view of part of the display panel PNL taken along line A-B shown in FIG. 4. In FIG. 5, a direction from the first substrate SUB1 to the second substrate SUB2 is defined as a third direction Z. Further, the third direction Z is referred to as up or above, and the opposite direction to the third direction Z is referred to as down or below.

The first substrate SUB1 includes a first insulating substrate 10, an insulating film 11, an insulating film 12, an insulating film 13, an insulating film 14, an insulating film 15, an insulating film 16, the light-shielding layer LS1, the semiconductor layer SC, metal protection films M1 and M2, the gate electrode GE (gate line G1), the source line Sm, the relay electrode RE1, the common electrode CE, the pixel electrode E, a first alignment film AL1, etc.

The first insulating substrate 10 is a light transmissive substrate such as a glass substrate or a resin substrate. The insulating film 11 is formed on the first insulating substrate 10. The light-shielding layer LS1 is located on the insulating film 11. The light shielding layer LS1 serves as a shield against light transmitted to the semiconductor layer SC from a backlight unit BL which will be described later. The light-shielding layer LS1 is formed of a metal material such as titanium (Ti), for example. The insulating film 12 covers the light-shielding layer LS1 and is also formed on the insulating film 11. The semiconductor layer SC is located on the insulating film 12 and partially overlaps the light-shielding layer LS1. The semiconductor layer SC is formed of a transparent amorphous oxide semiconductor (TAOS), for example, but the semiconductor layer SC may be formed of polycrystalline silicon or amorphous silicon. The metal protection films M1 and M2 are spaced apart from each other and contact on an upper surface SA of the semiconductor layer SC. The insulating film 13 covers the semiconductor layer SC and the metal protection films M1 and M2.

The gate electrode GE, which is part of the gate line G1, is located on the insulating film 13 and is covered with the insulating film 14. The gate electrode GE is located directly above a region of the semiconductor layer SC which is opposed to the light-shielding layer LS1. The gate line G1 and the metal protection films M1 and M2 are formed of a metal material such as aluminum (Al), titanium (Ti), silver (Ag), molybdenum (Mo), tungsten (W), copper (Cu) or chromium (Cr), an alloy of these metal materials, etc., and may have a single layer structure or a multi-layer structure.

The source line Sm and the relay electrode RE1 are located on the insulating film 14 and are covered with the insulating film 15. The source line Sm and the relay electrode RE1 are formed of the same material and may be formed of the above-described metal material. The source line Sm contacts the metal protection film M1 in the contact hole CH2 which penetrates the insulating film 13 and the insulating film 14. The relay electrode RE1 contacts the metal protection film M2 in the contact hole CH1 which penetrates the insulating film 13 and the insulating film 14. That is, the metal protection film M1 is located between the semiconductor layer SC and the source line Sm, and the metal protection film M2 is located between the semiconductor layer SC and the relay electrode RE1.

The common electrode CE is located on the insulating film 15 and is covered with the insulating film 16. The pixel electrode PE is located on the insulating film 16 and is covered with the first alignment film AL1. Part of the pixel electrode PE is opposed to the common electrode CE via the insulating film 16. The common electrode CE and the pixel electrode PE are formed of a transparent conductive material such as indium tin oxide (ITO) or indium zinc oxide (IZO). In a location overlapping an opening of the common electrode CE, the pixel electrode PE contacts the relay electrode RE1 in a contact hole CH6 which penetrates the insulating film 15 and the insulating film 16. In the example illustrated, the contact hole CH6 is formed directly above the contact hole CH1. The insulating film 11, the insulating film 12, the insulating film 13, the insulating film 14 and the insulating film 16 are an inorganic insulating film of silicon oxide, silicon nitride, silicon oxynitride, etc., and may have a single layer structure or a multi-layer structure. The insulating film 15 is an organic insulating film such as acrylic resin.

The second substrate SUB2 includes a second substrate 20, a light-shielding layer BM, a color filter CF, an overcoat layer OC, a second alignment film AL2, etc.

The light-shielding layer BM and the color filter CF are located on a side of the second insulating substrate 20 which is opposed to the first substrate SUB1. The light-shielding layer BM is formed of a black colored resin material, for example, and the pixels are partitioned by the light-shielding layer BM. For example, the light-shielding layer BM is arranged in a location opposed to the wires such as the source line Sm, the gate line Q1, and the switching element Sw. The color filter CP is arranged in a location opposed to the pixel electrode PE and partially overlaps the light-shielding layer BM. The overcoat layer OC covers the color filter CF. The second alignment film AL2 covers the overcoat layer OC.

The color filter CF may be arranged in the first substrate SUB1. The light-shielding layer BM may be arranged between the color filter CF and the overcoat layer OC or between the overcoat layer OC and the second alignment film AL2. Further, a pixel which displays white may be added, and in this case, a white color filter may be arranged or an uncolored resin material may be arranged in the white pixel, or the overcoat layer OC may be arranged without any color filter.

The first substrate SUB1 and the second substrate SUB2 are arranged such that the first alignment film AL1 and the second alignment film AL2 are opposed to each other. A predetermined cell gap is formed between the first alignment film AL1 and the second alignment film AL2. The cell gap is 2 to 5 µm, for example. The first substrate SUB1 and the second substrate SUB2 are attached to each other by a sealant with the predetermined cell gap formed.

The liquid crystal layer LC is located between the first substrate SUB1 and the second substrate SUB2 and is held between the first alignment film AL1 and the second alignment film AL2. The liquid crystal layer LC includes liquid crystal molecules. The liquid crystal layer LC is formed of a liquid crystal material having positive dielectric anisotropy or a liquid crystal material having negative dielectric anisotropy.

With respect to the display panel PNL having the above-described structure, a first optical element OD1 including a first polarizer PL1 is arranged below the first substrate SUB1. Further, a second optical element OD2 including a second polarizer PL2 is arranged above the second substrate SUB2. For example, the first polarizer PL1 and the second polarizer PL2 are arranged such that absorption axes thereof orthogonally cross each other in an X-Y plane. The first optical element OD1 and the second optical element OD2 may include a retardation film such as a quarter-wave plate or a half-wave plate, a scattering layer, an antireflective layer, etc., as needed.

In this structural example, the liquid crystal molecules included in the liquid crystal layer LC are initially aligned in a predetermined direction between the first alignment direction AL1 and the second alignment film AL2 in an off state in which an electric field is not formed between the pixel electrode PE and the common electrode CE. In the off state, the light emitted from the backlight unit BL toward the display panel PNL is absorbed by the first optical element OD1 and the second optical element OD2, and the display becomes dark. On the other hand, in an on state in which an electric field is formed between the pixel electrode PE and the common electrode CE, the liquid crystal molecules are aligned in a direction different from the initial alignment direction, and the alignment direction is controlled by the electric field. In the on state, part of the light from the backlight unit BL is transmitted through the first optical element OD1 and the second optical element OD2, and the display becomes bright.

Figure 6:
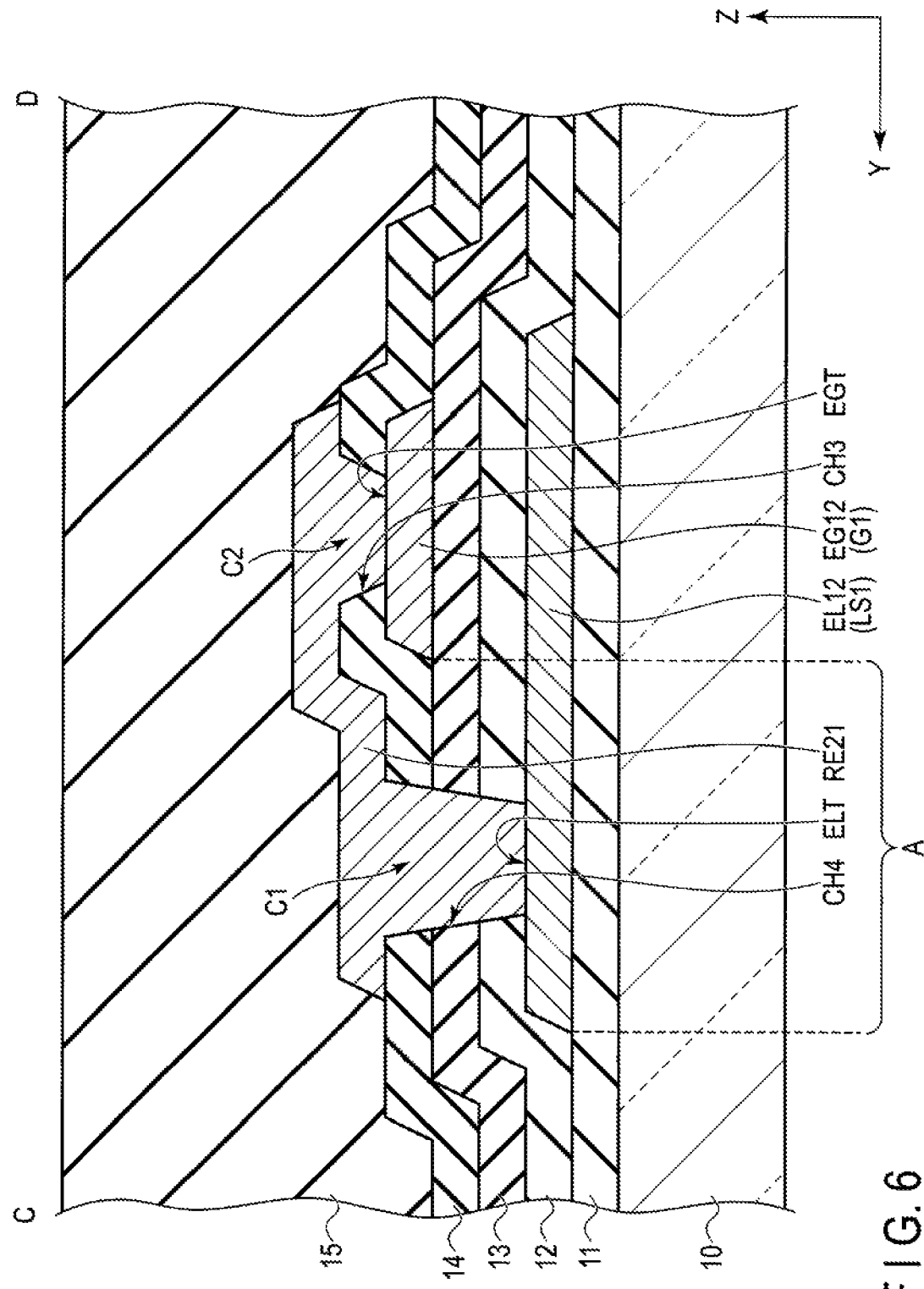
FIG. 6 is a sectional view of part of the display panel taken along line C-D shown in FIG. 4.

FIG. 6 is a sectional view of part of the display panel PNL taken along line C-D shown in FIG. 4. FIG. 6 only shows the main portions of the first substrate SUB1.

The other end EL12 has a region A extending beyond the other end EG12 in the second direction Y. The relay electrode RE21 is located on the insulating film 14 and overlaps the region A and the other end EG12. In other words, the gate line G1 is located between the relay electrode RE21 and the light-shielding layer LS1 but is not interposed between the region A and the relay electrode RE21. The relay electrode RE21 can be formed of the same material in the same manufacturing process together with the source line Sm and the relay electrode RE1 shown in FIG. 5.

The contact hole CH3 is formed directly above the other end EG12 and penetrates the insulating film 14. The contact hole CH4 is formed directly above the region A and penetrates the insulating film 14, the insulating film 13 and the insulating film 12. The relay electrode RE21 contacts an upper surface EGT of the other end EG12 in the contact hole CH3 and contacts an upper surface ELT of the other end EL12 in the contact hole CH4. In this way, the light-shielding layer LS1 and the gate line G1 are electrically connected to each other. In the example illustrated, a first contact portion C1 in which the relay electrode RE21 and the light-shielding layer LS1 contact each other and a second contact portion C2 in which the relay electrode RE21 and the gate line G1 contact each other are arranged in the second direction Y.

In the present embodiment, the insulating film 12 corresponds to the first insulating film, the insulating film 13 corresponds to the second insulating film, and the insulating film 14 corresponds to the third insulating film. The contact hole CH4 corresponds to the first through hole which penetrates the third insulating film, the second insulating film and the first insulating film, and the contact hole CH3 corresponds to the second through hole which penetrates the third insulating film.

According to the present embodiment, the light-shielding layer LS overlapping the gate line G is provided. Therefore, it is possible to prevent the property deterioration and improve the reliability of the switching element SW including the semiconductor layer SC formed of an oxide semiconductor layer.

The light-shielding layer LS and the gate line G are electrically connected to each other. Therefore, it is possible to prevent the light-shielding layer LS from becoming electrically floating. Further, the light-shielding layer LS and the gate line G are connected to each other in the non-display area NDA. Therefore, as compared to a case where the light-shielding layer LS and the gate line G are electrically connected to each other in each pixel PX, for example, the floating of the light-shielding layer LS can be prevented without reducing the aperture ratio.

Further, the light-shielding layer LS is electrically connected to the gate line G at both ends. Therefore, as compared to a case where the light-shielding layer LS is connected to the gate line G at only one end, the time taken for the potential of the light-shielding layer LS to become the same as that of the gate line G can be shortened. That is, even if the light-shielding layer LS and the gate line G have different time constants due to differences in material, width, film thickness, etc., the influence of the time constant difference can be suppressed. Accordingly, degradation in display quality can be prevented.

Still further, the contact holes CH3 and CH4 which overlap the relay electrode RE21 are arranged in the second direction Y. Therefore, the width of the non-display area NDA in the first direction X can be reduced as compared to a case where the contact holes CH3 and CH4 are arranged in the first direction X, tor example. Still further, as shewn in FIG. 3, for example, when the gate lines G arranged in the second direction Y are connected to the gate driver GD1 and the gate driver GD2, alternately, the width of the first non-display area NDA1 and the width of the second non-display area NDA2 can be uniformed, and this is suitable for narrowing the frame.

Next, another structural example will be described.

A structural example shown in FIG. 7 differs from the structural example shown in FIG. 3 in that both ends of the light-shielding layer LS is connected to the gate line 3 via the relay electrode RE2. One end EL11 of the light-shielding layer LS1 is located in the first non-display area NDA1 but is spaced apart, from the first driver GD1. In the example illustrated, one end EL11 is located between the gate driver GD1 and the source line S1. The light-shielding layer LS1 is connected to the gate line G1 via the relay electrode RE21a overlapping one end EL11 and the relay electrode RE21b overlapping the other end EL12.

Further, the other end EL22 of the light-shielding layer LS2 is located in the second non-display area NDA2 but is spaced apart from the gate driver GD2. In the example illustrated, the other end EL22 is located between the source line Sm and the gate driver GD2. The light-shielding layer LS2 is connected to the gate line G2 via the relay electrode RE22a overlapping one end EL21 and the relay electrode RE22b overlapping the other end EL22.

The structures of one end EL11 and the other end EL22 are the same as those of the other end EL12 and one end BL21. In the present embodiment, the relay electrode RE21b corresponds to the first relay electrode, and the relay electrode RE21a corresponds to the second relay electrode. The structure of the light-shielding layer LS3 is the same as that of the light-shielding layer LS1, and thus detailed description thereof will be omitted. The same advantages as those of the structural example shown in FIG. 3 can be obtained also in the present structural example.

Figure 8:
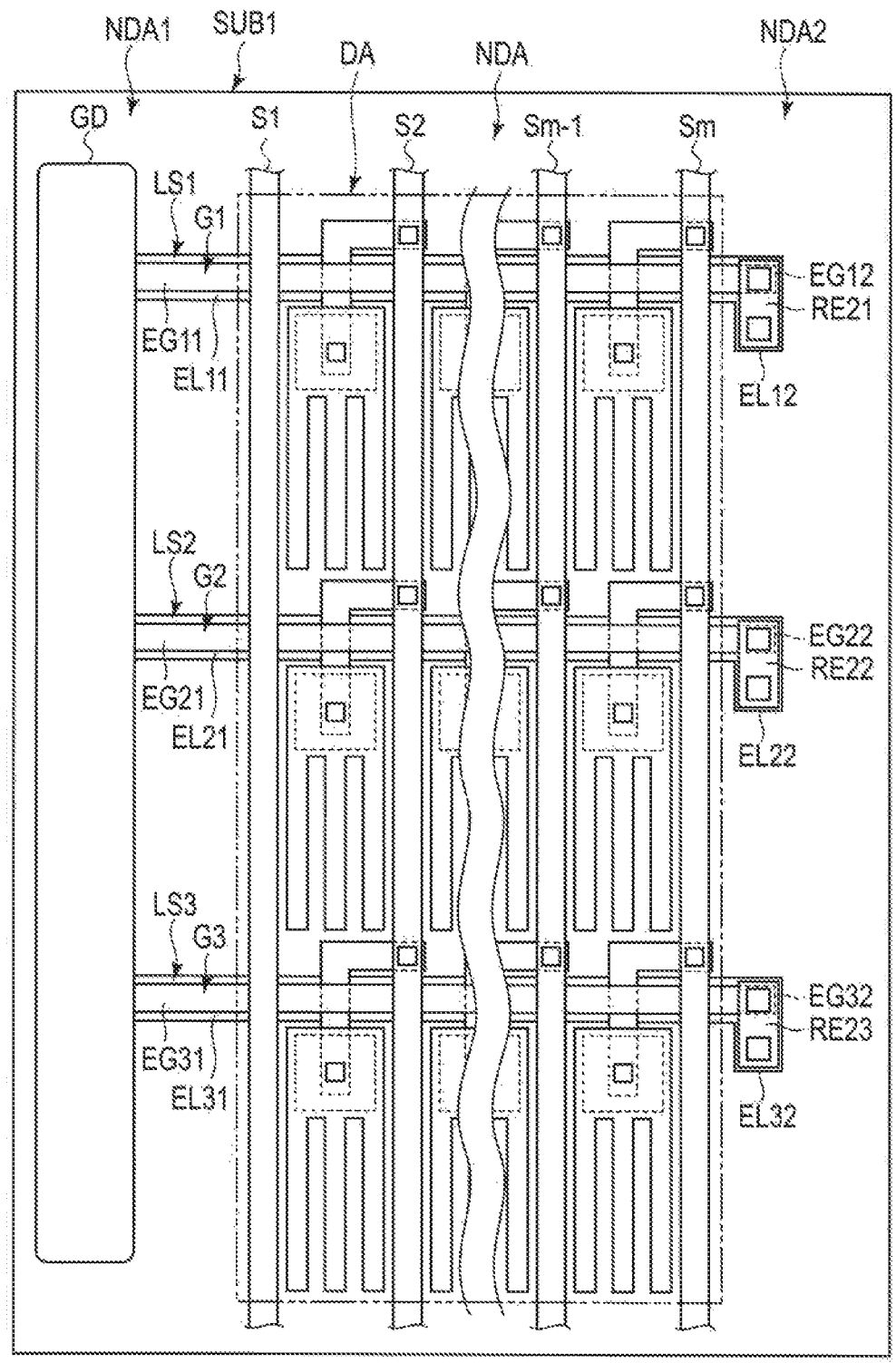
FIG. 8 is a plan view of another structural example of the first substrate.

A structural example shewn in FIG. 8 differs from the structural example shown in FIG. 3 in that the first substrate SUB1 has one gate driver GD.

In the example illustrated, the gate driver GD is provided in the first non-display area NDA1. One ends BG11, BG21 and EG31 and one ends EL11, EL21 and EL31 are connected to the gate driver GD in the first non-display area NDA1. The other ends EG12, EG22 and EG32 and the other ends EL12, EL22 and EL32 are located in the second non-display area NDA2. The light-shielding layers LS1, LS2 and LS3 are connected to the gate lines G1, G2 and G3 via the relay electrodes RE21, RE22 and RE23 overlapping the other ends EG12, EG22 and EG32 and the other ends EL12, EL22 and EL32, respectively. One ends EL11, EL21 and EL31 may be connected to the gate lines G1, G2 and G3 via the relay electrodes RE21a, RE22a and RE23a as shown in FIG. 7.

The same advantages as those of the structural example shown in FIG. 3 can be obtained also in the present structural example.

Figure 9:
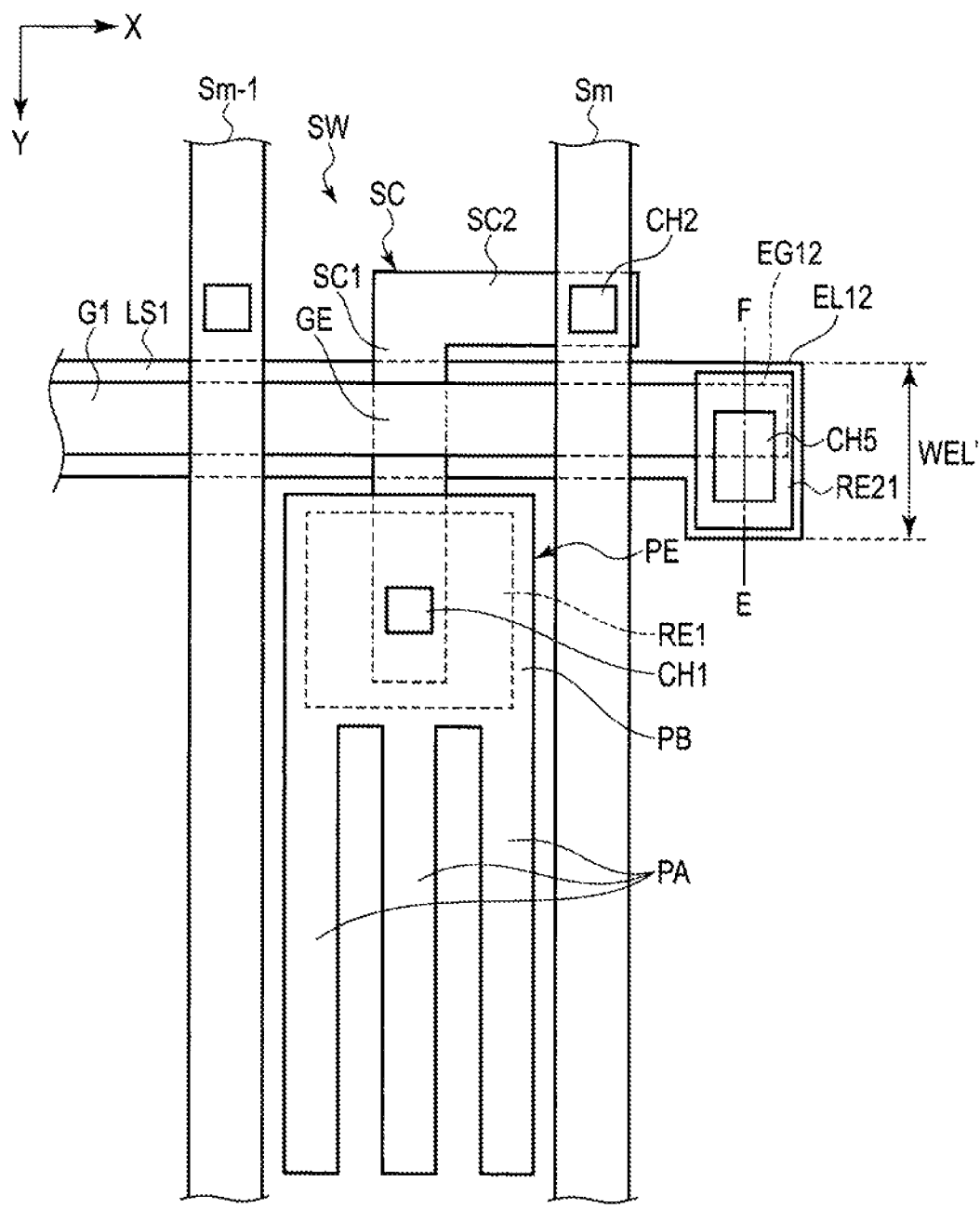
FIG. 9 is a plan view of another structural example of the first substrate.

A structural example shown in FIG. 9 differs from the structural example shown in FIG. A in that the other end EG12 and the other end EL12 are connected to each other in one contact hole CH5 (through hole).

The contact hole CHS is located within a region in which the relay electrode RE21 is provided, and overlaps the other end EG12 and the other end EL12. In the example illustrated, the contact hole CHS is located in a substantially center of the relay electrode RE21. In the contact hole CHS, the area of a region overlapping the other end EG12 is substantially equal to the area of a region overlapping the other end EL12. The contact hole CHS has a rectangular shape in the example illustrated but may have another shape. Further, a width WEL' of the other end EL12 may be less than the width WEL shown in FIG. 4.

Figure 10:
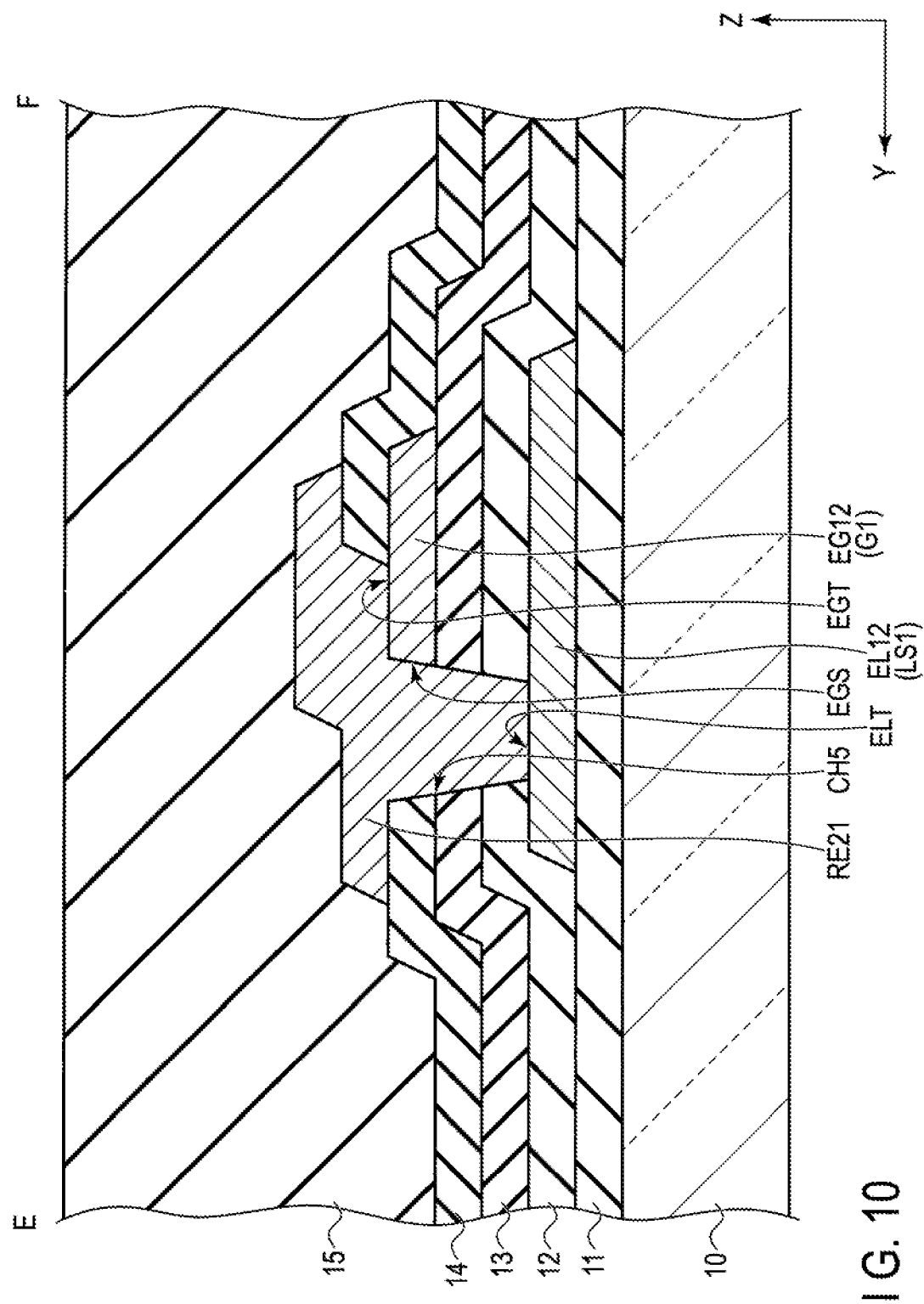
FIG. 10 is a sectional view of part of the display panel taken along line E-F shown in FIG. 9.

FIG. 10 is a sectional view of part of the display panel PNL taken along line E-F shown in FIG. 9. The contact hole CHS penetrates the insulating film 14, the insulating film 13 and the insulating film 12. In the contact hole CHS, the relay electrode RE21 contacts the insulating film 14, the insulating film 13 and the insulating film 12 and also contacts the upper surface ELT. Further, the relay electrode RE21 contacts the upper surface EGT and also contacts a side surface EGS of the other end EG12.

The same advantages as those of the structural example shown in FIG. 3 can be obtained also in the present structural example. Further, according to the present structural example, the area of the relay electrode RE21 can be reduced.

As described above, according to the present embodiment a display device which can prevent degradation in display quality can be provided While certain embodiments have been described, these embodiments have teen presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate including semiconductors arranged in a matrix comprising:
    an insulating substrate;
    a first gate driver;
    a first gate line having a first end connected to the first gate driver and a second end opposite to the first end, and extending in a first direction; and
    a metal line located between the insulating substrate and the first gate line, overlapping the first gate line, and extending in the first direction, wherein
    the second end of the first gate line is electrically connected to the metal line,
    the metal line has a third end and a fourth end opposite to the third end,
    the third end is electrically connected to either the first gate driver or the first gate line, and
    the fourth end is electrically connected to the second end.

2. The substrate of claim 1, wherein
    the insulating substrate includes an active area, a first peripheral area adjacent to the active area, and a second peripheral area adjacent to the active area and opposite to the first peripheral area,
    the first gate driver is located in the first peripheral area, and
    the second end is located in the second peripheral area.

3. The substrate of claim 2, wherein
    a first width of the fourth end in a second direction crossing the first direction is greater than a second width of the metal line in the active area in the second direction.

4. The array substrate of claim 1, further comprising a first electrode which overlaps the fourth end and the second end and contacts the first gate line and the metal line.

5. The substrate of claim 4, further comprising:
    a first contact portion in which the metal line and the first electrode contact each other; and
    a second contact portion in which the first gate line and the first electrode contact each other, wherein
    the first contact portion and the second contact portion are arranged in a second direction crossing the first direction.

6. The array substrate of claim 5, further comprising a second electrode which overlaps the third end and contacts the first gate line and the metal line.

7. The substrate of claim 1, further comprising an oxide semiconductor which crosses the first gate line and the metal line and is located between the first gate line and the metal line.

8. The substrate of claim 1, wherein a time constant of the first gate line and a time constant of the metal line are different from each other.

9. The substrate of claim 1, wherein the metal line is a light-shielding layer.

10. A display device comprising:
the substrate of claim 1;
a second substrate facing the substrate; and
a liquid crystal layer or electroluminescent display element provided between the substrate and the second substrate, wherein
a pixel is provided in a display area of the substrate; and
an electrode which contacts the first gate line and the metal line is provided outside the display area.

11. The display device of claim 10, wherein
a first width of the fourth end in a second direction crossing the first direction is greater than a second width of the metal line in the display area in the second direction.

12. The display device of claim 10, further comprising an oxide semiconductor which crosses the first gate line and the metal line and is located between the first gate line and the metal line.

13. The display device of claim 10, wherein a time constant of the first gate line and a time constant of the metal line are different from each other.

14. The display device of claim 10, wherein the metal line is a light-shielding layer.

* * * * *